United States Patent
Dellea et al.

(10) Patent No.: US 9,358,575 B2
(45) Date of Patent: Jun. 7, 2016

(54) METHOD FOR DEPOSITING PARTICLES ONTO A SUBSTRATE, INCLUDING A STEP OF STRUCTURING A PARTICLE FILM ON A LIQUID CONVEYOR

(71) Applicant: Commissariat a l'energie atomique et aux ene alt, Paris (FR)

(72) Inventors: Olivier Dellea, La Talaudiere (FR); Philippe Coronel, Barraux (FR); Simon Frederic Desage, Saint-Chamond (FR); Pascal Fugier, Bernin (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 153 days.

(21) Appl. No.: 14/375,994

(22) PCT Filed: Feb. 8, 2013

(86) PCT No.: PCT/EP2013/052502
§ 371 (c)(1),
(2) Date: Jul. 31, 2014

(87) PCT Pub. No.: WO2013/117679
PCT Pub. Date: Aug. 15, 2013

(65) Prior Publication Data
US 2015/0044809 A1    Feb. 12, 2015

(30) Foreign Application Priority Data
Feb. 10, 2012  (FR) ...................................... 12 51255

(51) Int. Cl.
*B05D 5/00* (2006.01)
*B05D 1/20* (2006.01)
(Continued)

(52) U.S. Cl.
CPC .. *B05D 5/00* (2013.01); *B05D 1/20* (2013.01); *B05D 1/26* (2013.01); *B82Y 30/00* (2013.01);
(Continued)

(58) Field of Classification Search
CPC ........ B05D 1/20; B05D 1/26; B05D 2252/02; B05D 2401/32; B05D 5/00
See application file for complete search history.

(56) References Cited

U.S. PATENT DOCUMENTS

| | | | | |
|---|---|---|---|---|
| 4,801,476 A | * | 1/1989 | Dunsmuir | ................ B05D 1/20 118/402 |
| 6,068,878 A | * | 5/2000 | Alwan | .................... H01J 9/025 427/180 |

(Continued)

FOREIGN PATENT DOCUMENTS

| | | |
|---|---|---|
| CA | 2695449 A1 | 2/2008 |
| WO | 99 38623 | 8/1999 |

(Continued)

OTHER PUBLICATIONS

U.S. Appl. No. 14/232,092, filed Jan. 10, 2014, Savelli, et al.

(Continued)

*Primary Examiner* — James M Mellott
(74) *Attorney, Agent, or Firm* — Oblon, McClelland, Maier & Neustadt, L.L.P.

(57) ABSTRACT

A method for depositing particles on a substrate, or a running substrate, including: (a) producing at least one first compact film of particles floating on a carrier liquid provided in a transfer area having an outlet of particles arranged facing the substrate; (b) producing at least one pattern by depositing a substance on the first film in the transfer area, along a contour of the pattern, the substance maintaining the particles of the film together in contact with the substance; (c) removing at least one portion of the particles of the first film located interiorly relatively to the contour, or exteriorly relatively to the contour; and then (d) transferring patterns onto the substrate through the outlet of particles.

14 Claims, 8 Drawing Sheets

(51) Int. Cl.
  *B82Y 30/00* (2011.01)
  *B05D 1/26* (2006.01)
  *H01L 21/02* (2006.01)
  *H01L 31/18* (2006.01)
  *H01L 51/00* (2006.01)

(52) U.S. Cl.
  CPC .......... *H01L 21/02282* (2013.01); *H01L 31/18* (2013.01); *H01L 51/0001* (2013.01); *B05D 2252/02* (2013.01); *B05D 2401/32* (2013.01)

(56) References Cited

U.S. PATENT DOCUMENTS

| | | | |
|---|---|---|---|
| 6,423,172 B1 | 7/2002 | McArdle et al. | |
| 7,804,134 B2 | 9/2010 | Coronel et al. | |
| 2005/0129867 A1* | 6/2005 | Picard | B01D 69/122 427/434.3 |
| 2005/0281944 A1* | 12/2005 | Jang | B05D 1/202 427/180 |
| 2011/0135834 A1* | 6/2011 | Schneider | B05C 9/02 427/420 |
| 2012/0321810 A1* | 12/2012 | Tebby | B05D 1/18 427/443.2 |
| 2013/0052552 A1 | 2/2013 | Phan et al. | |
| 2013/0330471 A1* | 12/2013 | Dellea | B05C 19/02 427/180 |
| 2014/0147583 A1* | 5/2014 | Dellea | B05C 19/00 427/180 |
| 2014/0158334 A1 | 6/2014 | Dellea et al. | |
| 2014/0356528 A1* | 12/2014 | Dellea | H01L 21/67721 427/180 |
| 2014/0374930 A1* | 12/2014 | Dellea | B05D 1/20 264/1.7 |
| 2015/0010693 A1* | 1/2015 | Dellea | B05D 1/20 427/58 |
| 2015/0217328 A1* | 8/2015 | Dellea | B05C 19/008 427/180 |

FOREIGN PATENT DOCUMENTS

WO   01 89716   11/2001
WO   03 095108   11/2003

OTHER PUBLICATIONS

U.S. Appl. No. 14/369,752, filed Jun. 30, 2014, Dellea, et al.
U.S. Appl. No. 14/375,858, filed Jul. 31, 2014, Dellea, et al.
U.S. Appl. No. 14/375,532, filed Jul. 30, 2014, Dellea, et al.
Kinge, S. et al. "Self-Assembling Nanoparticles at Surfaces and Interfaces" ChemPhysChem, vol. 9, No. 1, pp. 20-42, 2008 XP055042089.
International Search Report Issued May 28, 2013 in PCT/EP13/052502 Filed Feb. 8, 2013.
U.S. Appl. No. 14/398,340, filed Oct. 31, 2014, Savelli, et al.
U.S. Appl. No. 14/423,957, filed Feb. 25, 2015, Dellea, et al.

* cited by examiner

METHOD FOR DEPOSITING PARTICLES ONTO A SUBSTRATE, INCLUDING A STEP OF STRUCTURING A PARTICLE FILM ON A LIQUID CONVEYOR

TECHNICAL FIELD

The invention relates to the domain of methods for depositing particles on a substrate, preferably a running substrate.

More specifically, it relates to the deposition of a film of ordered particles, preferably of the monolayer type, for which the size of the particles may be comprised between a few nanometers and a few hundred micrometers. The particles, preferably of spherical shape, may for example be silica particles.

The invention essentially relates to a step for structuring the film of particles before its deposition on the substrate, this structuration aiming at shaping the film so as to for example integrate other particles therein, and/or objects. Another possibility consists of providing recessed areas of particles, surrounded by the film which remains ordered.

In the case of integration of objects into the film, the question is in particular to manufacture devices with a hybrid nature, such as for example sensors. As an indication, a hybrid device by definition associates on a same substrate, objects having various functions, for example electronic, optical, electro-optical, piezoelectric, thermoelectrical, mechanical functions, etc.

The objects to be integrated to the film of particles are for example:
- active electronic components, such as transistors, microprocessors, integrated circuits, etc.;
- passive components of electronics, such as resistors, capacitors, diodes, photodiodes, coils, conductive tracks, weld preforms, etc.;
- optical components, such as lenses, microlenses, diffraction gratings, filters, etc.;
- battery cells, micro-battery cells, micro-batteries, photo detectors, solar cells, RFID systems, etc.;
- nano- or micro-metric particles or aggregates, either active or passive, for example of the type: oxides, polymers, metals, semiconductors, janus (particles having two faces with different natures or properties), nanotubes, etc.;

More particularly, the invention relates to the integration of objects for which the dimensions extend:
- for components: from a microscopic scale (a few tens of microns), to a macroscopic scale (more than about ten centimeters); and
- for particles and aggregates: from one nanometer to several hundred microns.

More generally, the invention has applications in the field of fuel cells, optics, photonics, of polymer coating, chips, MEMs, of surface structuration for organic electronics and photovoltaics, etc.

STATE OF THE PRIOR ART

For depositing films of ordered particles, a technique for transferring a film of ordered particles onto a substrate, via a liquid conveyor, has been developed recently. Nevertheless, usual structuration techniques do not prove to be adapted when the question is to transfer the film, organized beforehand, onto a substrate via a liquid conveyor.

SUMMARY OF THE INVENTION

The object of the invention is therefore to at least partly remedy the drawback mentioned above. To do this, the object of the invention is a method for depositing particles on a substrate, preferably a running substrate, comprising the following steps:
(a) producing at least one first compact film of particles floating on a carrier liquid provided in a transfer area having an outlet of particles arranged facing said substrate;
(b) producing at least one pattern by depositing a substance on said first compound film of particles in the transfer area, along a contour of said pattern, said substance maintaining the particles of the film together in contact with this substance;
(c) removing at least one portion of the particles of the first film interiorly located relatively to said contour, or exteriorly relatively to the latter; and then
(d) transferring the patterns onto said substrate, through said outlet of particles.

The invention thus provides a simple and effective solution allowing structuration of a film of ordered particles before depositing it on the substrate, this structuration aiming at shaping the film in order to integrate different particles and/or objects thereto for example, or quite simply by leaving the inside of the patterns free of particles.

According to a first preferred embodiment of the invention, step (c) consists of removing said particles located interiorly relatively to each contour, this step being optionally followed, before step (d), by a step for placing one or several other elements, on the carrier liquid in the recessed area delimited by each contour, step (d) being carried out by displacing together each pattern and said first film through said outlet of particles, and, if necessary, with said one or several other elements.

Among the contemplated elements for being placed in the recessed areas, mention is made of silicon chips, micro-batteries, components of organic electronics, metal elements, photovoltaic cells, battery cells and micro-battery cells. These elements notably give the possibility of manufacturing devices with a hybrid nature, such as for example sensors. As mentioned above, the patterns may be left free of particles until their deposition on the substrate together with the first film, and optionally filled in later on after the deposition.

Alternatively, other particles may be accommodated in the recessed areas.

According to a second preferred embodiment, step (c) consists of removing said particles located exteriorly relatively to each contour, this step being followed, before step (d), by a step for making a second compact film with particles (4) floating on the carrier liquid in the transfer area, around each contour, step (d) being carried out by moving together each pattern and said second film through said outlet of particles.

It is noted that the patterns containing the ordered particles may be moved relatively to each other before forming the second film of particles in the transfer area. Here, said second film may be produced by means of particles different from those of said first film, for example with distinct composition and/or size. This notably allows formation of a film with gradients, which is then deposited on the substrate.

According to a second preferred embodiment of the invention, step (a) consists of producing a plurality of first compact films of particles respectively in different portions separated from said transfer area, step (b) consists of producing at least one pattern on each first compact film, step (c) consists of removing, in each of said portions of said transfer area, said particles located exteriorly relatively to each contour, the patterns are then optionally moved relatively to each other on the carrier liquid, and a step for producing a second compact film of particles floating on the carrier liquid in the transfer area, around said patterns, is then produced before step (d) consisting of transferring together said patterns and the second film through said outlet of particles.

Here also, said second film is produced by means of particles different from those of said first films, which themselves are preferably produced with different particles, in material and/or in size.

Preferably, said substance comprises a polymerizable compound, which is polymerized after its deposition on the first compact film of particles.

The use of such a polymerizable substance proved to be quite adapted to the context of transferring objects through a liquid conveyor. In particular, during its application, any polymerizable substance is capable of adapting to the possible differences of levels between the particles of the first film. Thus, the material used adapts to the contour of the generated geometrical pattern. It may also be adapted to the surface or to the possible curvature of the substrate onto which the film is then transferred.

This substance, once it is polymerized, forms one or several solid cords which may be electric, thermal, optical or mechanical connectors, for example intended for connecting two or several objects. Alternatively, the cords may be without any function other than that of delimiting recesses, either subsequently filled or not, and in this case, they may be removed after their transfer onto the substrate.

Other types of substances may be retained, always in order to ensure maintaining of the particles in contact with the substance, even after the step (c) for removing the particles, thus showing the contour. This gives the possibility of retaining the shape of the pattern before forming the second film of particles, or before the filling of the pattern emptied beforehand, depending on the applied embodiment.

In the preferred case of a substance containing a polymerizable compound, the polymerization is carried out with any technique said to be suitable by one skilled in the art, preferably a thermal or optical technique. It is complete or partial before step (c), or else initiated after this step. In every case, during step (c), the substance is found in a condition allowing the geography of the pattern to be maintained in spite of the removal of the ordered particles within or outside this pattern, whether this substance is partly or totally polymerized, or even not polymerized as yet.

Preferably, during the transfer onto the substrate, the substance which adheres to the particles in contact with it, whether it is polymerized or not, remains sufficiently flexible so as to support possible flexure upon passing from the transfer area to the substrate.

Depending on the encountered needs, the diameter of the obtained cords may be between a few tens of microns and several millimeters.

Preferably, said substance appears as a liquid or slurry.

Preferably, said substance has hydrophobicity, and also preferably in the polymerized solid state of the cord.

More generally, notably taking into account cases when the carrier liquid is not water, it is noted that the substance proves to be non-miscible with the carrier liquid.

Preferably, said substance is based on silicone resin, epoxy resin and/or polyurethane resin.

Preferably, in order to give the contour of the pattern, a function of a electric conductor and/or thermal conductor, said substance comprises at least certain particles taken from the following materials:
  carbon black;
  carbon nanotubes;
  grapheme;
  fibers, such as carbon, steel, aluminium, copper fibers;
  metal powders; and
  metal oxides.

For the first embodiment mentioned above, in the particular case of an implantation of an object in the recessed area of the pattern, the contour surrounded by the first compact film gives the possibility of maintaining the objects in position on the carrier liquid, and then of conveying it as far as the substrate. Indeed, in this solution, the contour defines a disruption of level with the carrier liquid. It is this level disruption which hems in the object, thereby allowing it to be maintained in position and to be transported as far as the substrate. The transfer of the objects may therefore be accurately carried out on the substrate, in a simple, reliable and repetitive way.

The first compact film of particles is therefore related to a platform with which homogeneous or heterogeneous, nanoscopic, microscopic or macroscopic objects may be received. This platform may itself consist of a homogenous or heterogeneous assembly of nanometric or microscopic particles, preferably with different compositions from those of the objects to be transferred. Further, as mentioned above, the compact film of particles may be formed with heterogeneous particles. These particles may also be functionalized at their surface so as to form a physical bond between particles, for example of the polymeric type, in order to reinforce the cohesion and therefore the load-bearing capacity of the compact film.

Preferably, the ratio between the large dimension of the particles of the first compact film and that of the objects to be transferred is comprised between $10^4$ and $10^8$. As an example, the particles forming the first compact film may have a large dimension of the order of 1 nm to 500 µm, while the objects conveyed by this film may, as for them, have a large dimension ranging up to about 30 cm.

Preferably, the particles of the first compact film are silica beads with a diameter of about 1 Nevertheless it is noted that the film may be heterogeneous, i.e. include beads with different sizes.

Preferably, each object to be transferred has a large dimension of more than 0.2 cm, and preferably less than 30 cm. The latter value may be adapted according to the width of the transfer area. Indeed, the last dimension of each object may attain a value close to the aforementioned width. Objects with a micrometric or nanometric size may also be deposited/transferred, without departing from the scope of the invention.

Preferably, each object to be transferred has at least one portion with hydrophobicity. This is provided so as to ensure floating of the object, by placing this portion in contact with the carrier liquid. This face in contact with the liquid may be totally hydrophobic or include an arrangement of hydrophilic and hydrophobic areas, useful for the final device.

The object to be transferred, certain examples of which have been mentioned earlier, may be of any shape, not necessarily planar, optionally having one or several radii of curvature, for example of less than 5 cm, or further integrating useful pads for connections. Also, for the particles of the first film, the shapes may be varied, but are preferably homogeneous.

By means of this first embodiment, the target is also the manufacturing of complex devices such as for example sensors comprising detection elements (particles for example), one or several energy recovery systems (photovoltaic cell, piezoelectric film, fuel cell), an energy storage system (micro-battery), an information management system (silicon chip), a communications system (RFID chip), electric connecting elements (conductive tracks), electronic components (resistors, capacitors), weld elements (preforms). The objects required for obtaining these devices are then arranged on the liquid conveyor accordingly, and are, if need be, superposed.

Moreover it is noted that the first compact film of particles, for which the concept is for example disclosed in the document Sachin Kinge, "Self-Assembling Nanoparticles at Surfaces and Interfaces", ChemPhysChem 2008, 9, 20-42, may be obtained at the surface of the carrier liquid by any technique known to one skilled in the art, for example my compression, and/or dipole-dipole interaction, and/or by a magnetic field, etc.

The dipole-dipole interaction technique is applied for particles with facets, for example tetrahedral, cubic or further octahedral particles. With these shapes, the dipole-dipole interactions play an important role in the organization of the particles. The dipolar moments are generated inside these particles, because of the difference in polarity between the facets.

The magnetic field organization technique is used with magnetic nanoparticles which may be ordered by using an intense magnetic field, generating strong interactions between the particles.

The compression technique is notably known from the document Lucio Isa et al., "Particle Lithography from Colloidal Self-Assembly at Liquid_Liquid Interfaces", ACS Nano, Vol. 4■No. 10■5665-5670■2010, from the document Markus Retsch, "Fabrication of Large-Area, Transferable Colloidal Monolayers Utilizing Self-Assembly at the Air/Water Interface", Macromol. Chem. Phys. 2009, 210, 230-241, or further from document Maria Bardosova, "The Langmuir-Blodgett Approach to Making Colloidal Photonic Crystals from Silica Spheres", Adv. Mater. 2010, 22, 3104-3124.

This compression technique also comprises the tilted ramp solution described in document CA 2,695,449. Thus, the method according to the invention preferentially applies a tilted ramp for circulation of the particles, attached to an inlet of the transfer area, and on which said carrier liquid is also intended to circulate.

A portion of the energy required for ordering the particles under normal conditions is then brought here by the tilted ramp transporting the carrier liquid and the particles. Other solutions are nevertheless possible, such as setting in to motion, by means of a pump, some carrier liquid on a horizontal plane, the downstream portion of which forms the transfer area of the particles. Another solution consists of replacing the pump with a fan allowing an airflow to be applied to the surface of the carrier liquid, on which float the particles and the objects to be transferred. As mentioned above, other solutions may nevertheless be contemplated, without departing from the scope of the invention, like a particle compression work via a so-called 'Langmuir-Blodgett' technique.

Moreover it is noted that the second film of particles occurring in the second and third preferred embodiments are similar to the first film, even if the particles are generally provided so as to be of different natures. Regardless of the case, the whole of the possibilities described above for the first film also apply for the second film.

Finally, after the transfer onto the substrate, the method preferably integrates a thermal annealing step for facilitating the deposition and the adherence of these particles, patterns and objects on the substrate.

Other advantages and features of the invention will become apparent in the non-limiting detailed description below.

BRIEF DESCRIPTION OF THE DRAWINGS

This description will be made with reference to the appended drawings wherein.

DETAILED DESCRIPTION OF PREFERRED EMBODIMENTS

Figure 1:
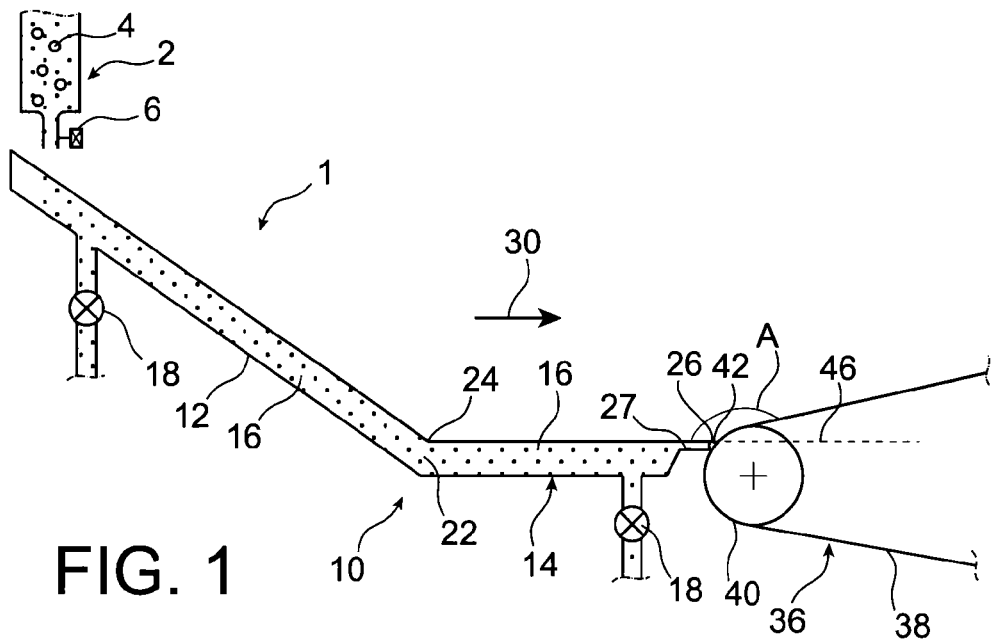
FIG. 1 shows a deposition facility according to a preferred embodiment of the present invention, in a schematic sectional view taken along the line I-i of FIG. 2.
Figure 2:
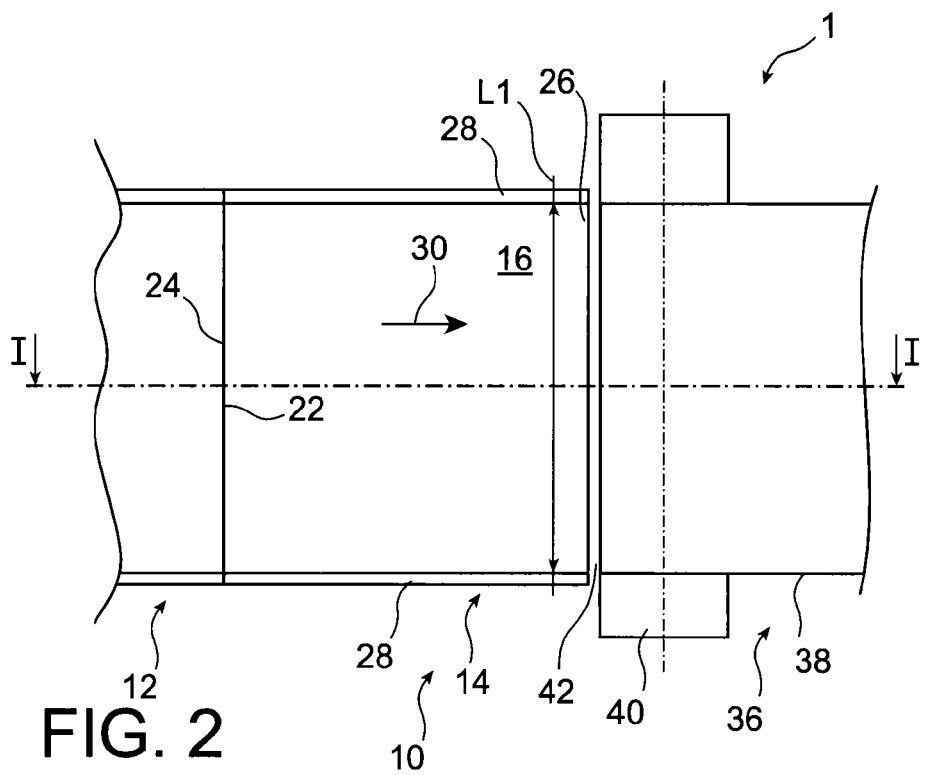
FIG. 2 illustrates a schematic top view of the deposition facility shown in FIG. 1.

First of all with reference to FIGS. 1 and 2, a facility 1 for transferring particles onto a substrate, preferably a running substrate, may be seen. This transfer which may be assimilated to deposition, is carried out by forming a first compact film of particles, which is then structured depending on the encountered needs, as this will be detailed hereafter.

The facility 1 includes a device 2 for dispensing particles 4, the size of which may be comprised between a few nanometers and several hundred micrometers. The particles, preferably of spherical shape, may for example be silica particles. Other particles of interest may be made of metal or metal oxide such as platinum, $TiO_2$, of polymer like polystyrene or PMMA, of carbon, etc.

More specifically, in the preferred embodiment, the particles are silica spheres with a diameter of about 1 μm, stored in a solution in the dispensing device 2. The proportion of the medium is about 7 g of particles for 200 ml of solution, here butanol. Naturally, for the sake of clarity, the particles illustrated in the figures adopt a greater diameter than their actual diameter.

The dispensing device 2 has a controllable injection nozzle 6, with a diameter of about 500 μm.

The facility also includes a liquid conveyor 10, integrating a tilted ramp 12 for circulation of the particles, and a substantially horizontal transfer area 14, or even having a slightly tilt so as to promote emptying of the installation, if necessary. The high end of the tilted ramp is provided for receiving the injected particles from the dispensing device 2. This ramp is straight, tilted by an angle comprised between 5 and 60°, preferably between 10 and 30°, allowing the particles to be brought towards the transfer area 14. Further, a carrier liquid 16 circulates on this ramp 12, as far as in the transfer area. This liquid 16 may moreover be re-circulated by means of one or two pumps 18, between the transfer area 14 and the high end of the ramp. Preferably this is here de-ionized water, on which the particles 4 may float. Nevertheless, preference may be given to a new liquid via an open circulation circuit. This may also be an association of several non-miscible liquids.

The low end of this same ramp is connected to an inlet of the transfer area of the particles 14. This inlet 22 is located at an inflexion line 24 materializing the junction between the surface of the carrier liquid present on the tilted plane of the ramp 12, and the surface of the carrier liquid present on the horizontal portion of the transfer area 14.

The inlet of particles 22 is spaced apart from an outlet of particles 26 by means of two side edges 28 retaining the carrier liquid 16 in the area 14. These edges 28 facing each other and at a distance from each other, extend parallel to a main flow direction of the carrier liquid and of the particles in the facility, this direction being schematized by the arrow 30 in FIGS. 1 and 2. The area 14 therefore assumes the shape of a corridor or of a path open at its inlet and at its outlet, even if other geometries may be adopted, without departing from the scope of the invention.

The bottom of the downstream portion of the transfer area has a plateau 27 slightly tilted upstream relatively to the horizontal direction, for example by a value of the order of 5 to 10°. This is the downstream end of the same plateau 27, also called <<blade>> which partly defines the outlet of the particles 26.

The facility 1 is also provided with a substrate conveyor 36, intended to set the substrate 38 into running motion. This substrate may be stiff or flexible. In the latter case, it may be set into motion on a roller 40, the axis of which is parallel to the outlet 26 of the area 14, near which it is located. Indeed, the substrate 38 is intended to run very close to the outlet 26, so that the particles attaining this outlet may easily be transferred on to the substrate, via a capillary bridge 42, also called a meniscus, which connects it to the carrier liquid 16. Alternatively, the substrate may be directly in contact with the transfer area, without departing from the scope of the invention. The capillary bridge mentioned above is then no longer required.

For information, in the case when the substrate is stiff and the objects to be transferred are also stiff and cannot adapt to an angle rupture during the transfer, it may be advantageous to immerse the substrate in the liquid of the transfer area, and to carry out the drawing action in this configuration. This allows maximization of the angle formed between the horizontal plane of the liquid of the transfer area, and the plane of the substrate.

In the example shown in the figures, the width of the substrate corresponds to the width of the area 14 and its outlet 26. This is a width L1 which also corresponds to the maximum width of the film of particles which it is possible to deposit on the substrate. This width may be of the order of 25 cm to 30 cm. The width of the substrate on which the particles have to be deposited may however be less than the width L1.

The capillary bridge 42 is provided between the carrier liquid 16 which is located at the outlet 26, and a portion of the substrate 38 fitting the guiding/driving roller 40.

Preferably, the protruding angle A, formed between the horizontal direction 46 and the portion of the substrate 38 on which the film of particles and the objects have to be deposited, is greater than 160°, and even more preferentially close to 180°, for example the order of 175°.

A method for depositing particles according to a first embodiment will now be described with reference to FIGS. 3 to 7e.

First of all, the injection nozzle 6 is activated in order to begin the dispensing of the particles 4 on the ramp 12. The idea is to apply an initial step for filling the transfer area 14, with the particles 4, with the carrier liquid 16 already at the required level in the area 14.

Figure 3:
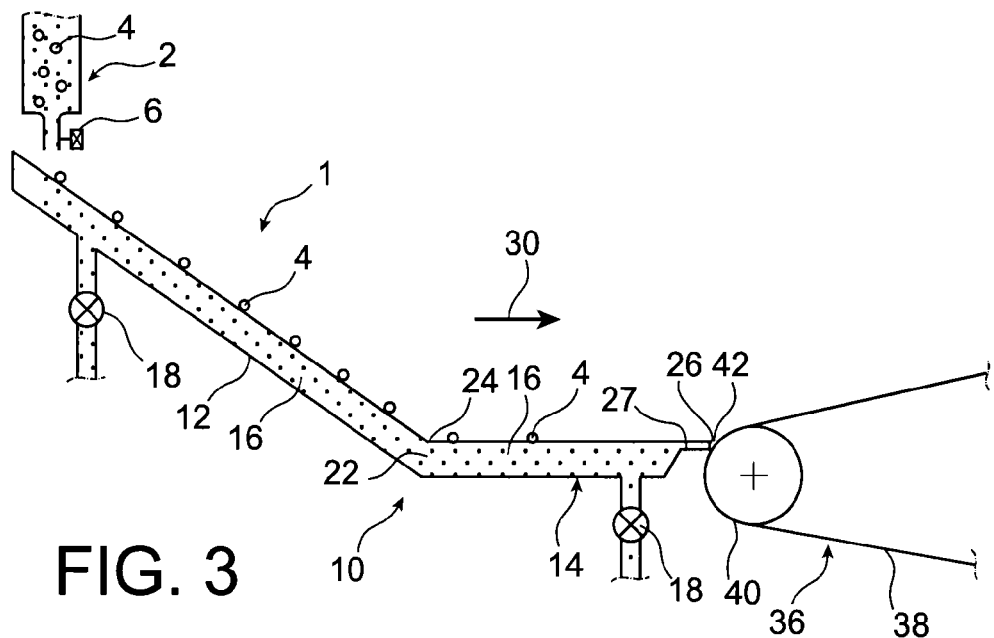
FIGS. 3 to 7 illustrate various steps of a deposition method applied by means of the facility shown in the previous figures, according to a first preferred embodiment.
Figure 4:
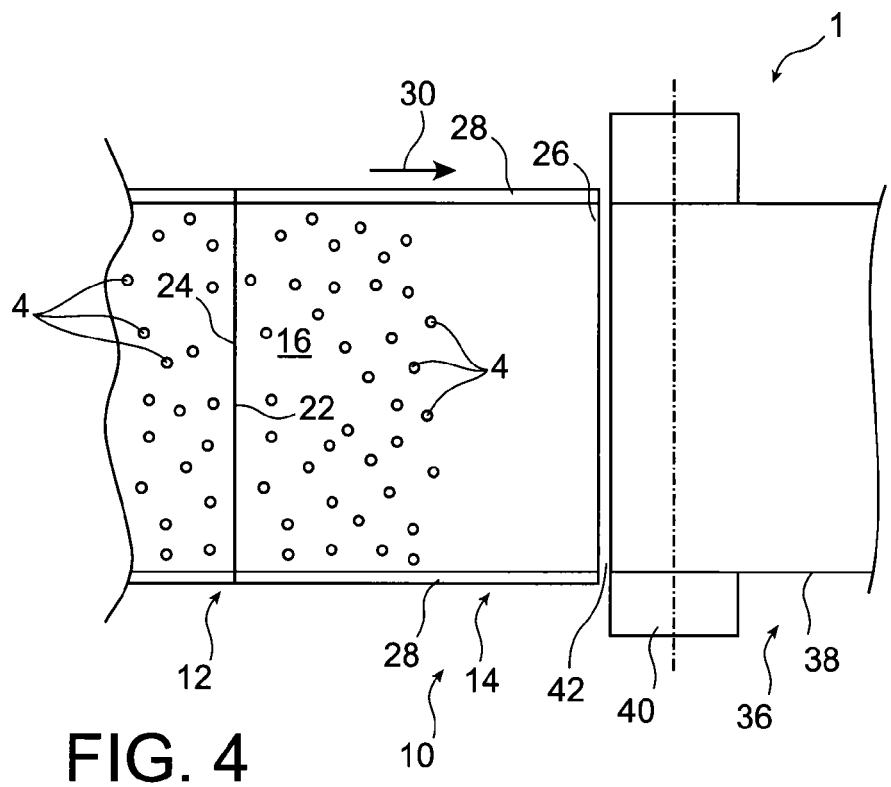

During this initiation phase, the particles dispensed by the device 2 saturate on the ramp 12, and then penetrate into the area 14 in which they are dispersed, as this has been schematized in FIGS. 3 and 4.

As the particles 4 are gradually injected on the ramp 12 and penetrate into the transfer area 14, they will abut against the substrate 38, and then the upstream front of these particles tends to be shifted upstream, in the direction of the inflection line 24. The injection of particles is continued even after this upstream front has gone beyond the line 24, so that it goes up back onto the tilted ramp 12.

Figure 5:
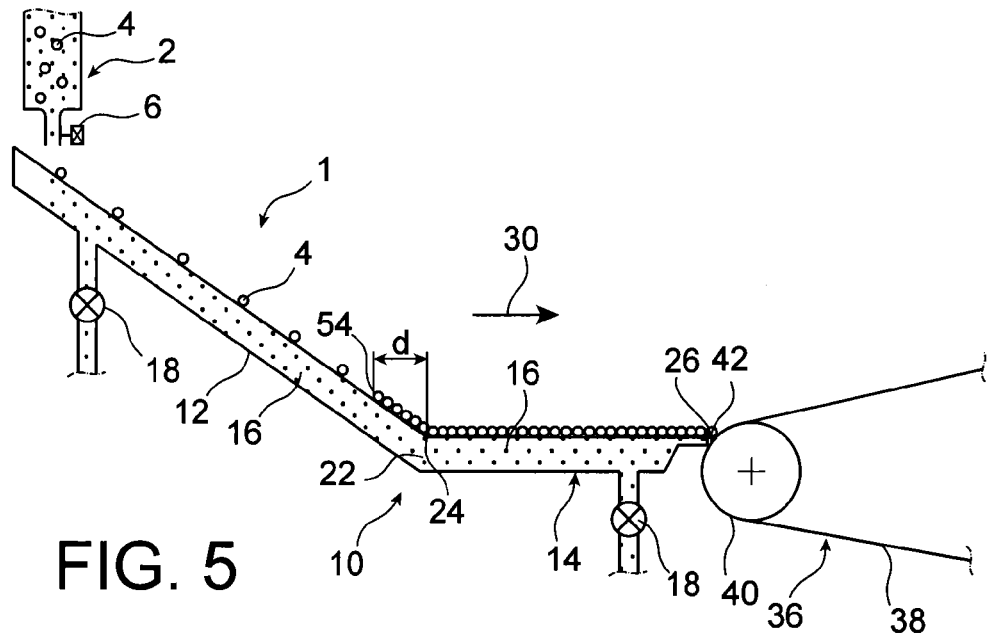

Actually, it is ensured that the upstream front of particles 54 goes up again on the ramp 12 so that it is located at a given horizontal difference <<d>> of the inflection line 24, as shown in FIG. 5. The distance <<d>> may be of the order of 30 mm.

At this instant, the particles 4 are ordered in the transfer area and on the ramp 12, on which they are ordered automatically, without any assistance, notably by means of their kinetic energy and of the capillary forces utilized upon impact on the front 54. The ordering is such that the first compact film obtained has a so-called <<compact hexagonal>> structure, in which each particle 4 is surrounded and contacted by six other particles 4 in contact with each other. This is then equally referred to as a compact film of particles, or a film of ordered particles.

Figure 6A:
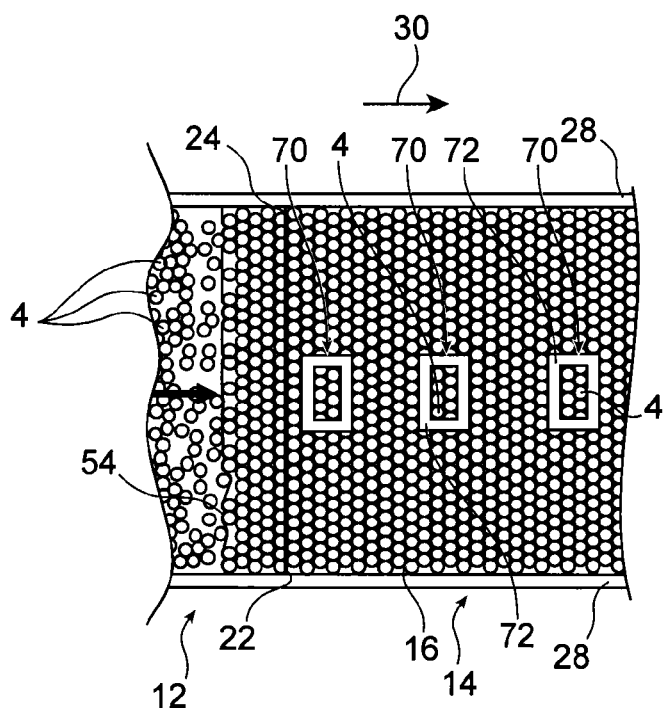

Once the ordered particles 4 forming the first film cover the whole of the carrier liquid located in the transfer area 14, it is proceeded with a step for making patterns 70 on the film 4, by depositing a substance 72 on the particles, along a contour of the patterns. For each pattern, after the deposition of the substance 72, the latter forms along a closed line the contour of the relevant pattern. FIG. 6a shows an example of several patterns 70 defined by their contours made by means of the deposited substance 72, allowing the particles wetted by the substance 72 to be maintained relatively to each other, which is here preferably of the type comprising a polymerizable compound. The particles 4 located interiorly and exteriorly relatively to the contours 72 in the form of cords remain ordered.

A deposition of the polymerizable substance is for example carried out by means of a dispensing nozzle (not shown). Upon arriving in contact with the particles, the substance 72 is capable of adapting to the topography of the first ordered film, and adheres to the particles 4 which it covers.

The polymerizable compound is for example a silicone resin, an epoxy resin, and/or a polyurethane resin. The polymerization is carried out in a conventional way, for example via a thermal and/or optical route, and preferably occurs at least partly when the substance is still found in the transfer area, not yet deposited on the substrate.

The substance 72 then appears as a liquid or slurry, to which particles may be added before its dispensing in order to functionalize the connectors which are then obtained after polymerization. These connectors may have electric, thermal, optical, piezoelectric and/or mechanical functions. As indicative examples, for electric and/or thermal connectors, the added particles may be carbon black, carbon nanotubes, graphene, fibers such as carbon, steel, aluminum, copper fibers, metal powders, metal oxides.

Moreover, it is indicated that the substance is retained so that it allows some flexibility of the cord during transfer onto the substrate, in order to support flexure during the passage from the transfer area to the substrate, and this because of the tilt A of the substrate relatively to the horizontal direction. This flexibility should therefore subsist after partial or total polymerization of the cord in the transfer area, before transfer onto the substrate.

Preferably, the substance 72 has hydrophobicity in the liquid state, so that the latter remains at the surface of the carrier liquid after its dispensing on the film of particles 4, if the substance reaches this same surface of the carrier liquid. Whatever the case, the substance 72 after its deposition on the first film adheres to the latter because of its composition. Further, the substance is also selected so as to remain insoluble in the carrier liquid in the liquid state, and also in the solid state after polymerization.

Polymerization is therefore preferentially carried out before transfer onto the substrate, in order to obtain flexible cords, with a diameter preferably comprised between a few tens of microns and a few millimeters, maintaining the particles 4 together which are in contact with it and also maintaining the initial shape of the patterns.

The next step of the process for structuring the film lies in the removal of the particles 4 located in the pattern 70, interiorly relatively to the contours formed by the substance 72. In this respect, as mentioned above, it is noted that during the carrying out of this withdrawal step, the substance is located in a state allowing the geometry of the pattern to be maintained in spite of the removal of the ordered particles within the patterns, whether the substance is partly or totally polymerized, or even not polymerized as yet.

Figure 6B:
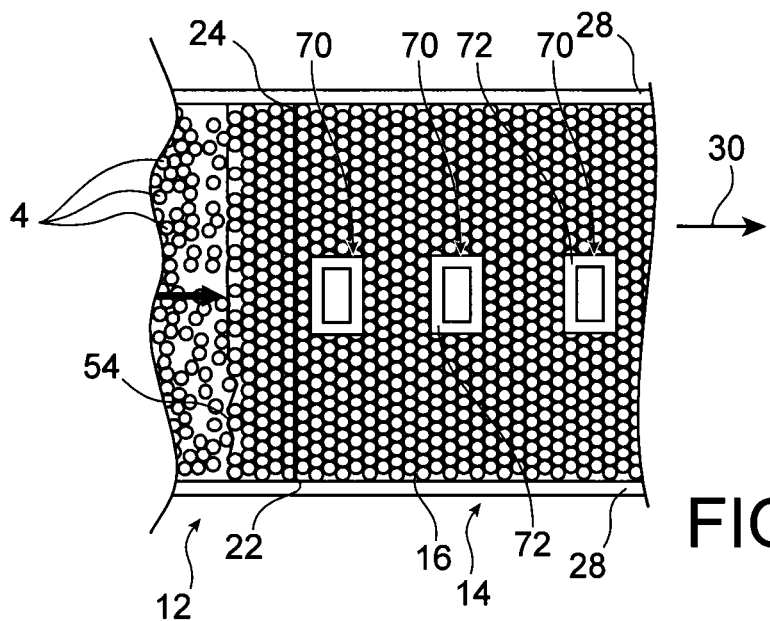
Figure 6C:
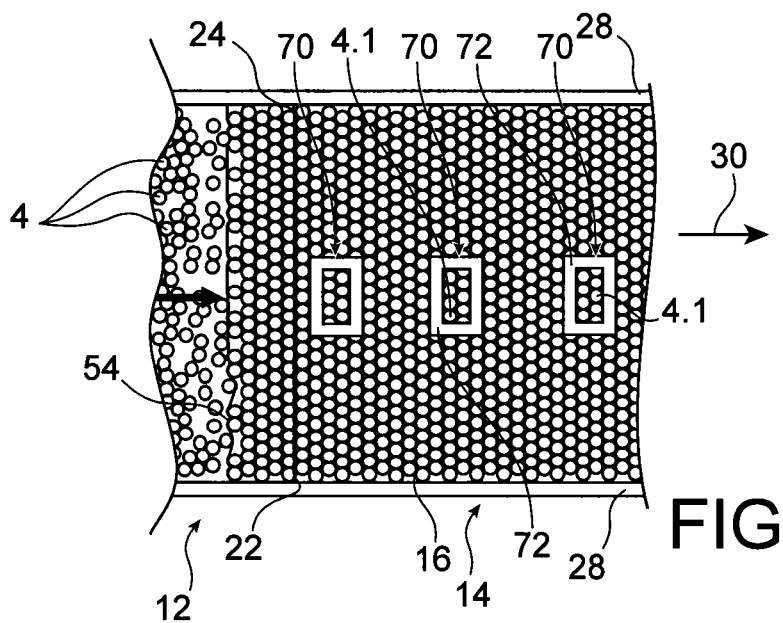

After removal of the particles, for example by simple suction, the interior of the pattern 70 is therefore emptied of particles, as this was schematized in FIG. 6b.

Next, diverse elements may be placed inside the patterns for replacing the removed particles. These elements may for example be other particles 4.1, schematized in FIG. 6c, similar to the particles 4 but with different composition and/or size, injected so as to be in turn ordered in the filled interior areas. These injections may be carried out according to any shape and known to be suitable by one skilled in the art, for example, by means of a microspray, a nozzle, an inkjet, or further by a conveyor.

The conveyor solution, of the type with a string or succession of rollers, is also preferentially retained in the case of integration of objects into the recessed areas, for example in order to form hybrid devices. Such objects 50 were schematically illustrated in FIG. 7, integrated within the first film 4, each being surrounded by the contour 72 of one of the patterns 70. These are then the same contours which surround the periphery of each object 50, thereby allowing them to be maintained in position relatively to each other, as well as relatively to the fixed structure of the transfer area. In the case when the object 50 is of a smaller size than the one formed by the pattern, addition of a structuring polymer may be contemplated for blocking the object in the pattern.

In addition to the conveyor solution, the setting into place of these objects may be achieved by means of handling or conventional grasping tools adapted to the nature, the shape and the size of the objects, like pliers. The objects 50 integrated to the first film 4 inside the patterns are held at the surface of the liquid by the surface tension of this liquid.

The setting into position of the objects 50 is preferentially carried out by stopping the flow of particles from the ramp 12, although this may be otherwise, without departing from the scope of the invention.

Figure 7:
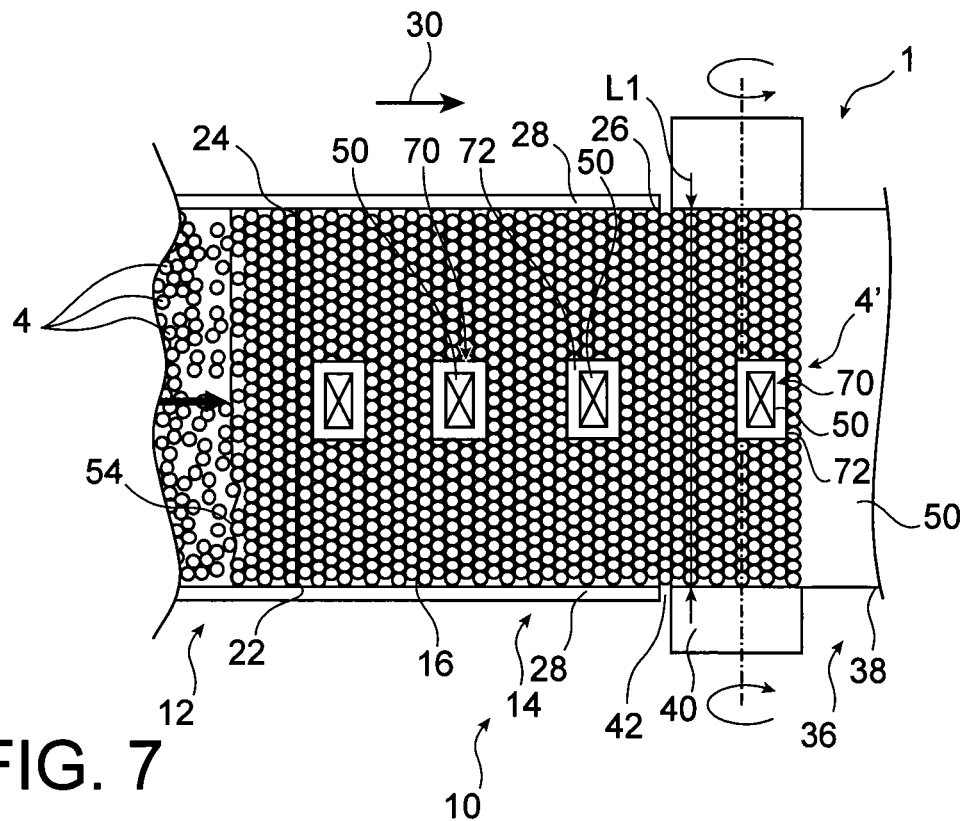

FIG. 7 shows the condition of the facility after triggering the movement of the substrate 38, initiated as soon as the front 54 has reached the required level illustrated in FIG. 5, and after the structuration process at described above. The first film of particles 4, the pattern 70 and the objects 50 or other particles 4.1 which are accommodated therein are then deposited together onto the substrate 38, by simultaneous displacement through the outlet 26, by passing through the capillary bridge, such as described in document CA 2,695,449. In other words, the displacement of the first film 4 gives the possibility of conveying the contours of the patterns as well as the elements which are found inside these patterns, even if the structuration process may intend to leave the patterns empty upon deposition onto the substrate, without departing from the scope of the invention.

As mentioned above, after the deposition, the width of the structured film 4' integrating the objects 50 corresponds to the width L1 of the outlet 26, even if a smaller width may be adopted, without departing from the scope of the invention.

Still more preferably, the substrate is directly in contact with the outlet of the particles.

The ordered particles 4, located exteriorly to the pattern 70, cover the whole remaining surface area of the carrier liquid 16 present in the transfer area. The ordering is thus retained until the moment for deposition at the outlet 26 of the area 14. Retention of this ordering ensures the maintaining of specific relative positioning between the objects 50, as well as a specific position relatively to the fixed side edges 28, until the structure film 4' is deposited onto the substrate.

In order to facilitate deposition and adherence of the particles 4, of the pattern 70 and of the objects 50 or of other particles 4.1 onto the substrate 38, preferably made in polymer, thermal annealing is provided after the transfer. This thermal annealing is for example carried out at 80° C., by using a low temperature rolling mat film based on polyester, for example marketed under the reference of PERFEX-MATT™, with a thickness of 125 μm.

The advantage of such a film as a substrate is that one of its faces becomes tacky at a temperature of the order of 80° C., which gives the possibility of facilitating adherence of the particles 4, 4.1 and of the objects 50 on the latter. As this temperature is relatively low as compared with the temperatures for elaborating the objects targeted by the invention such as silicon chips or photovoltaic cells, the attachment of these objects may be carried out without any deterioration.

More specifically, at this temperature, the particles 4 sink into the softened film 38, and thereby allow direct contact of the objects with the film, which leads to their adhesion.

Alternatively, the substrate 38 may be of the silicon, glass type or further a piezoelectric film.

It is noted that after the transfer, whether the patterns 70 are filled or not, the polymerized cords 72 may be retained on the substrate, or else be removed by preferably carrying away with them the particles 4 laid out in contact with these cords.

During the transfer, the injection of particles and the running speed of the substrate are adjusted so that the front of particles remains in a substantially identical position. To do this, the particle flow rate may be of the order of 0.1 ml/min to several ml/min, while the linear speed of the substrate 38, also designated as drawing speed, may be of the order of a few mm/min to several hundred mm/min. As mentioned above, the supply of particles 4 may be temporarily stopped when making the pattern 70 and/or during integration of the objects 50 or of the other particles 4.1 within these patterns.

In this respect, it is noted that the objects to be transferred may be of different kinds, depending on the desired applications. Preferentially, each object 50 has a large dimension greater than 0.2 cm and less than or equal to L1, i.e. close to 30 cm. The thickness is comprised between about ten micrometers and several tens of millimeters.

Certain types of objects to be transferred such as solar cells, micro-batteries and organic components have a simple shape of a square, or of a rectangle, or further of a disc, with small thickness and a surface area of the order of 0.1 to 100 $cm^2$.

These components may include pads or tapered plugs on the face in contact with the liquid for proceeding with their connection. Other object types for example aimed at the detection of elements, energy generation or further at transport of information, may have complex shapes, for example curved or spiral portions.

Moreover, the ratio between the large dimension of the particles 4 and that of the objects 50 is preferably comprised between $10^4$ and $10^8$. Indeed, the large dimension of the particles is for example of the order of 1 nm to 500 µm, while the conveyed objects 50 may have a large dimension ranging up to about 30 cm.

Preferably, the face of each object 50 in contact with the carrier liquid has hydrophobicity, but it is also possible to provide an arrangement of hydrophilic and hydrophobic portions at this face. As mentioned above, the surface tension of the carrier liquid also plays an important role in the floating of these objects.

The table below lists a few preferred examples for these objects 50.

| Nature | Dimensions | Field of Application |
|---|---|---|
| Polyethylene terephtalate (PET) with a structured gold layer at the surface | PET: 3 × 4 cm²; thickness 250 µm; PET: 1.5 × 0.9 cm²; thickness 250 µm, Au: thickness 30 nm | Organic electronics |
| Glass with a photovoltaic cell at the surface | 25 × 25 mm²; thickness 1.08 mm | Photovoltaic cell |
| Silicon chip | 3 × 3 cm²; thickness 500 µm 1 × 1 cm²; thickness 500 µm | Electronics |
| Micro-battery on silicon | 1 × 1 cm²; thickness 500 µm | Energy storage |
| Bi-metal blade metal material (eg.: zinc/copper) | 3.5 × 2 cm²; thickness 140 µm 5 × 1.6 cm²; thickness 200 µm 7 × 1.6 cm²; thickness 200 µm | Heat sensors |

Now referring to FIGS. 8a to 8d, a deposition method will be described according to a second preferred embodiment of the invention.

Figure 8A:
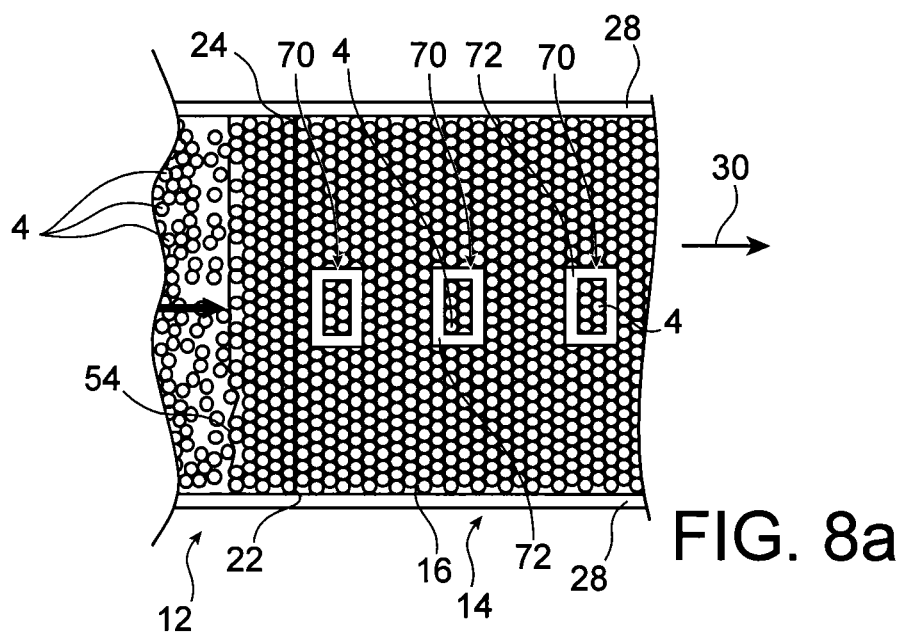
FIGS. 8a to 8d schematize a deposition method according to a second preferred embodiment.

FIG. 8a is identical with FIG. 6a, since this second embodiment is initiated in the same way as for the first embodiment described above, until the formation of the pattern 70 with a substance 72. Therefore, this portion of the method will not be further described.

Figure 8B:
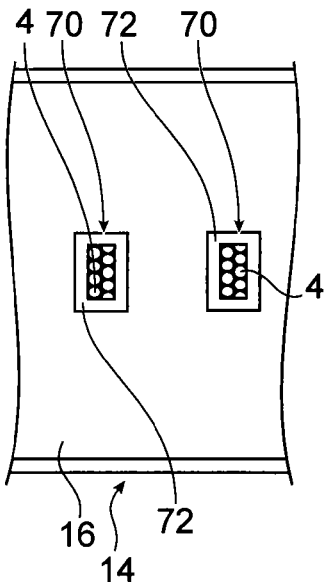

On the other hand, with reference to FIG. 8b, this method is continued by removing the particles of the first film 4 which are located around closed contours 72, preferably by suction. Only the ordered particles 4 located within the pattern 70 are retained.

Figure 8C:
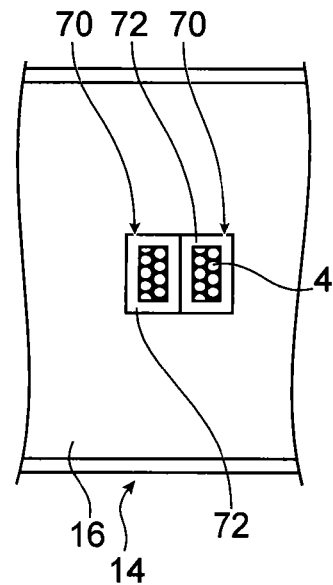
Figure 8D:
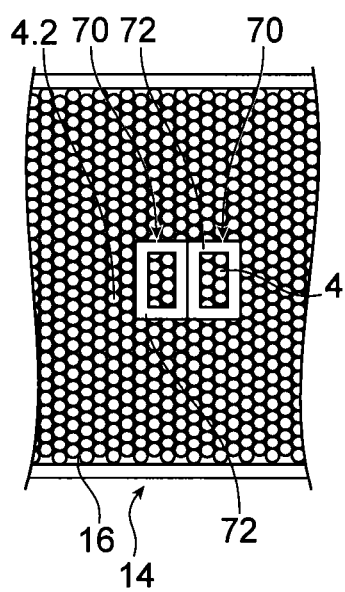

Next, as this was schematized in FIG. 8c, the patterns 70 are optionally moved relatively to each other in the transfer area 14 on the carrier liquid 16, for example in order to be brought closer to each other. The patterns 70, which retain their initial shape all along the structuration process, may be moved with suitable spikes surrounding the shape, or further be also maintained at their initial positions by such spikes, until the next step shown in FIG. 8d. As spikes, needles with a diameter to the order of a few hundred microns are used. Depending on the shapes of the object to be handled, three or four needles are generally required for stabilizing, positioning or orienting the object. These needles may be placed inside or outside the object. These needles are themselves moved, for example, by a manipulator arm with micrometric displacements. Once the object is positioned and once a new film of particles is formed around the object, the needles may be removed without generating any defect.

This step consists of producing a second film of ordered particles 4.2 in the transfer area 14, around the pattern 70. The formation of the second film 4.2 on the carrier liquid is identical or similar to that of the first film 4, and will therefore not be further described.

Next, it is the assembly formed by the pattern 70 filled with particles 4 and the second film 4.2, which is transferred onto the substrate, while passing through the outlet of particles, dedicated for this purpose.

The particles 4.2 are preferably here different in size and/or in material from the particles 4 of the first film. Also, just like in the first preferred embodiment, the geometry of the patterns may be varied, adapted according to the encountered needs, optionally provided for obtaining the deposition of a structured film having one or several particle gradients.

Finally, just like for the following embodiment, the cords of polymerized substance may be retained on the substrate or else removed.

With reference now to FIGS. 9a to 9d, a deposition method will be described according to a third preferred embodiment of the invention, which is derived from the second embodiment which has just been shown.

For applying this third preferred embodiment, the facility is slightly modified since the transfer area is segmented so as to have separate inlet portions 14a, as well as an outlet portion 14b. Each portion 14a has an inlet of particles 22a associated with a particle supply ramp, or alternatively, a single ramp is provided allowing successive co-operation with the inlets 22a of each of the portions 14. Further, each portion 14a opens into the outlet portion 14b, even if access to the latter may be selectively blocked/cleared, on command. Finally, it is the portion 14b which defines the outlet of particles 26 intended to be facing the substrate.

Figure 9A:
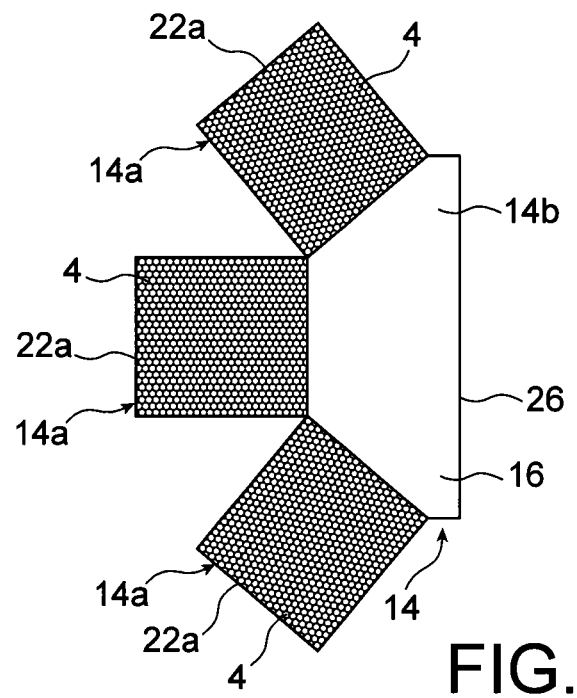
FIGS. 9a to 9d schematize a deposition method according to a third preferred embodiment.

First of all, the method is carried out by forming a first film of particles 4 in each of the inlet portions 14a of the transfer area 14, with access to the outlet portion 14b which is obturated. Such a configuration is illustrated in FIG. 9a, with the first films 4 which are ordered in their respective portions 14a so as to fill them entirely, in an identical or similar way to the one applied for the first embodiment, for the entirety of the transfer area. One of the particularities lies here in the fact that the particles 4 used may be different depending on the portions 14a.

Figure 9B:
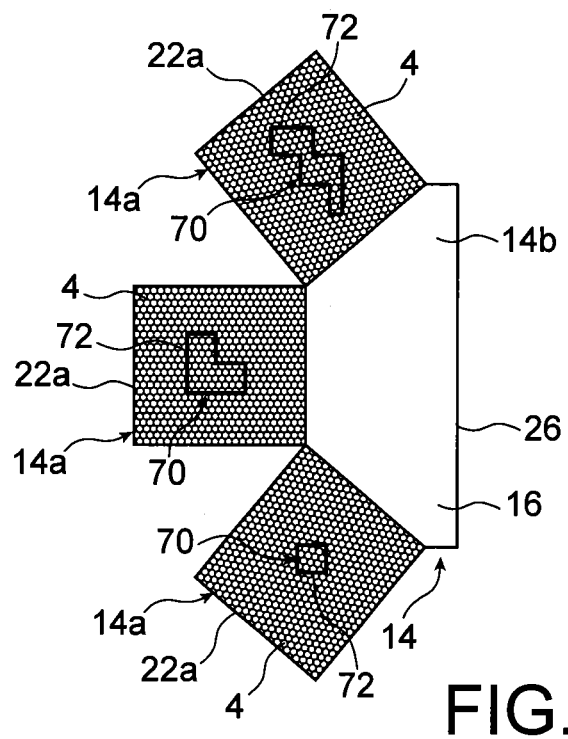

Next, one or several patterns 70 are made by means of the substance 72 in each of the inlet portions 14a, in an identical way with that used for the previous embodiment. Such patterns are illustrated in FIG. 9b.

Figure 9C:
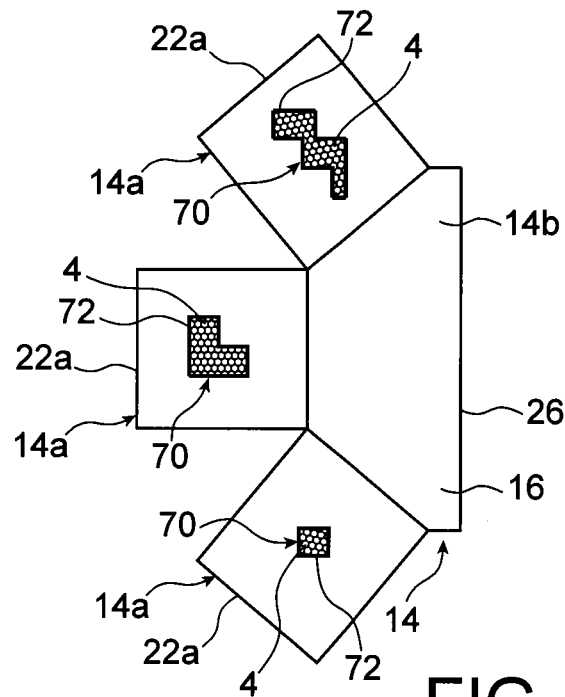

The structuration process is continued, just like in the second embodiment, by removing the particles 4 located exteriorly relatively to the pattern 70 following a closed contour 72, as this is visible in FIG. 9c. The patterns are then displaced, always for example by means of spikes, and re-arranged in the outlet portion 14b of the transfer area, after having cleared the accesses to this portion.

Figure 9D:
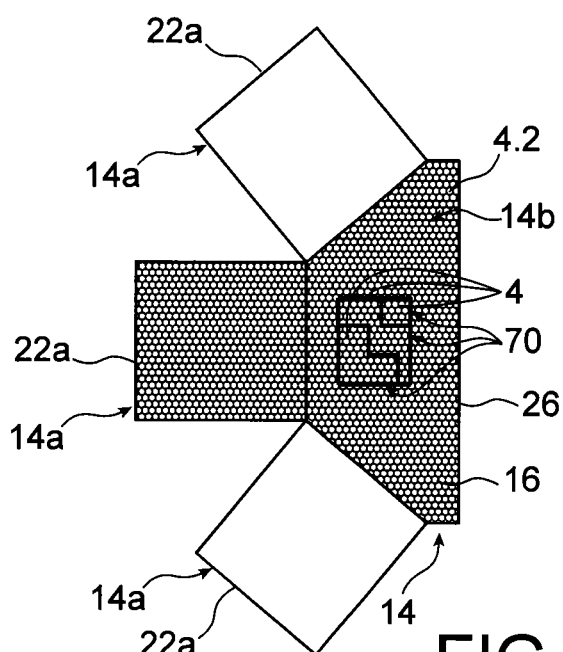

Always in a similar way to the second embodiment, a second film of ordered particles 4.2 is then made in the transfer area around the re-arranged patterns, preferably in only one of the portions 14a and in the portion 14b, as this was schematized in FIG. 9d.

After forming the second film of ordered particles 4.2, the transfer onto the substrate is carried out in a similar way to the one already discussed for the previous embodiment.

Regardless of the contemplated embodiment, the method may also include a step for making one or several cords or spikes on the film 4 or the film 4.2, or even on the particles 4.1, by means of the substance 72, when these particles are found on the carrier liquid in the transfer area. It is only after deposition on the substrate that these cords, preferably along a non-closed line, are removed, by leaving voids which may then be optionally filled with other elements. Upon removal of the cords/spikes of polymerized substance, the latter preferably carries away with it the particles 4 laid out in contact with these cords, because of the adherence between these elements.

Possible applications for the methods which have just been described were mentioned above. Practical examples are also described below.

This may be the manufacturing of photovoltaic cells and of components of the LED/PLED/OLED type. Recent studies have shown that the structuration of the interfaces in the field of photovoltaic components, LEDs, PLEDs, OLEDs may provide a significant gain in yield or in the emitted light. Within this scope, the compact films of particles are for example used as masking elements during steps for structuration of interfaces. These structurations are generally made through interstices present between the particles by depositions of materials or by plasma etching. Nevertheless certain areas of the substrate have to be recessed in order to, for example, leave the areas of electric contacts clear or simply because they do not have any particular function. With the method according to the first embodiment described above, it is therefore possible, before the transfer of the compact film onto the substrate, to define on the liquid with the substance the areas which should be clear of particles, and then remove them by suction.

Another example relates to heat exchangers. The structuration of the walls of the exchangers is a means for adjusting the heat exchanges. These structurations may be made by lithography with a mask of particles. With the methods described above, the application of heterogeneous deposits associating particles with different dimensions makes it possible to obtain geometries which are usually made by lithography, and notably for geometries with particle size gradients.

Still another example relates to chemical sensors. The methods described above provide the possibility of associating heterogeneous compact films with particles of different natures, and therefore of allowing detection of different natures of gas, chemical species, etc.

Finally, in tribology, there are four mechanical applications, compact films may be used as a lithography mask for generating micro/nanotanks allowing retention of the lubricant at the surface of the objects being rubbed. The adjustment of the dimensions of these retention micro/nanotanks is a perimeter for adjusting the friction coefficient. A simple means for changing the dimensions of these micro/nanotanks is to use as an etching mask, a heterogeneous compact film consisting of different sizes of particles, easy to obtain with the methods specific to the present invention.

Of course, diverse modifications may be made by one skilled in the art to the invention which has just been described, only as non-limiting examples.

The invention claimed is:

1. A method for depositing particles onto a substrate, comprising:
   (a) producing at least one first compact film of particles floating on a carrier liquid provided in a transfer area having an outlet of particles arranged facing the substrate;
   (b) producing at least one pattern by depositing a substance on the first compact film of particles in the transfer area along a contour of the pattern, the substance maintaining together the particles of the film in contact with the substance;
   (c) removing at least one portion of the particles of the first compact film located relatively to the contour or exteriorly relatively to the contour; and then
   (d) transferring the patterns onto the substrate, through the outlet of particles.

2. The method according to claim 1, wherein (c) includes removing the particles located interiorly relatively to each contour, being optionally followed, before (d), by placing one or plural other elements, onto the carrier liquid in a recessed area delimited by each contour, (d) being carried out by displacing together each pattern and the first film through the outlet of particles, and, if necessary, with the one or plural other elements.

3. The method according to claim 2, wherein at least one element selected from the group consisting of silicon chips, micro-batteries, components of organic electronics, metal elements, photovoltaic cells, battery cells, micro-battery cells, and second particles with a different size or composition from the particles in the first compact film are placed in each recessed area.

4. The method according to claim 1, wherein (c) includes removing the particles located exteriorly relatively to each contour, followed, before step (d), by making a second compact film of particles floating on the carrier liquid in the transfer area, around each contour, (d) being carried out by moving together each pattern and the second film through the outlet of particles.

5. The method according to claim 4, wherein the second film is made by particles different from those of the first film.

6. The method according to claim 1, wherein (a) includes producing a plurality of first compact films of particles respectively in different separate portions of the transfer area, wherein (b) includes producing at least one pattern on each first compact film, wherein (c) includes removing, in each of the portions of the transfer area, the particles located exteriorly relatively to each contour, wherein the patterns are then optionally displaced relatively to each other on the carrier liquid and wherein producing a second compact film of particles floating on the carrier liquid is then produced before (d) in the transfer area around the patterns, (d) including transferring together the patterns and the second film through the outlet of particles.

7. The method according to claim 6, wherein the second film is produced by particles different from those of the first films.

8. The method according to claim 1, wherein the substance comprises a polymerizable compound, which is polymerized after its deposition on the first compact film of particles.

9. The method according to claim 1, wherein the substance appears as a liquid or a slurry.

10. The method according to claim 1, wherein the substance is hydrophobic.

11. The method according to claim 1, wherein the substance is based on a silicon resin, epoxy resin, and/or polyurethane resin.

12. The method according to claim 1, wherein the substance comprises at least certain particles taken from following materials:
- carbon black;
- carbon nanotubes;
- graphene;
- fibers, or carbon, steel, aluminum, copper fiber;
- metal powders; and
- metal oxides.

13. The method according to claim 1, further comprising applying a tilted ramp for circulation of the particles, attached to the inlet of the transfer area, and on which the carrier liquid can circulate.

14. The method according to claim 1, further comprising producing at least one cord or spike by the substance deposited on the particles, the cord or spike being removed after its deposition on the substrate.

* * * * *